(12) United States Patent
Kim (10) Patent No.: US 10,083,954 B2
(45) Date of Patent: Sep. 25, 2018

(54) SEMICONDUCTOR DEVICE AND SYSTEM INCLUDING THE SAME

(71) Applicant: SK hynix Inc., Icheon-si, Gyeonggi-do (KR)

(72) Inventor: Wang Su Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 6 days.

(21) Appl. No.: 15/019,371

(22) Filed: Feb. 9, 2016

(65) Prior Publication Data

US 2017/0092641 A1    Mar. 30, 2017

(30) Foreign Application Priority Data

Sep. 25, 2015 (KR) .......................... 10-2015-0136447

(51) Int. Cl.
| | |
|---|---|
| *H01L 27/085* | (2006.01) |
| *H01L 27/092* | (2006.01) |
| *H01L 27/06* | (2006.01) |
| *H01L 29/06* | (2006.01) |
| *H01L 27/02* | (2006.01) |
| *H01L 27/105* | (2006.01) |
| *H01L 23/522* | (2006.01) |
| *H01L 23/00* | (2006.01) |

(52) U.S. Cl.
CPC ...... *H01L 27/0629* (2013.01); *H01L 23/5223* (2013.01); *H01L 27/0207* (2013.01); *H01L 27/092* (2013.01); *H01L 27/105* (2013.01); *H01L 29/0619* (2013.01); *H01L 23/564* (2013.01)

(58) Field of Classification Search
CPC ......... H01L 27/11807; H01L 29/66477; H01L 29/78; H01L 27/088; H01L 29/0847; H01L 29/1079; H01L 29/4232; H01L 29/66325; Y10S 257/901
See application file for complete search history.

(56) References Cited

U.S. PATENT DOCUMENTS

| | | | | |
|---|---|---|---|---|
| 5,159,204 A | * | 10/1992 | Bernacchi | .......... H03K 17/0822 |
| | | | | 257/372 |
| 5,883,423 A | * | 3/1999 | Patwa | ................. H01L 27/0688 |
| | | | | 257/532 |

(Continued)

FOREIGN PATENT DOCUMENTS

| | | |
|---|---|---|
| KR | 1020120088134 A | 8/2012 |
| KR | 1020120097981 A | 9/2012 |

*Primary Examiner* — Mary Wilczewski
*Assistant Examiner* — Tsz Chiu
(74) *Attorney, Agent, or Firm* — William Park & Associates Ltd.

(57) ABSTRACT

A semiconductor device may be provided. The semiconductor device may include a first guard ring disposed in a first region, and a second guard ring disposed in a second region. The semiconductor device may include a first metal line and a second metal line respectively disposed over the first guard ring and the second guard ring, and respectively coupled to the first guard ring and the second guard ring. The semiconductor device may include a gate pattern coupled to the first metal line or the second metal line, wherein the first metal line and the second metal line are configured to respectively receive a first voltage and a second voltage. The second voltage may have a different potential from the first voltage.

17 Claims, 6 Drawing Sheets

(56) References Cited

U.S. PATENT DOCUMENTS

| | | | | |
|---|---|---|---|---|
| 5,998,846 A * | 12/1999 | Jan | ............... | H01L 27/0207 257/296 |
| 6,349,067 B1 * | 2/2002 | Hsu | ............... | G11C 7/02 257/E21.544 |
| 7,250,660 B1 * | 7/2007 | Huang | ............... | H01L 27/0266 257/173 |
| 9,530,768 B1 * | 12/2016 | Kim | ............... | H01L 27/0274 |
| 2005/0082621 A1 * | 4/2005 | Chen | ............... | H01L 27/0277 257/371 |
| 2007/0164333 A1 * | 7/2007 | Wright | ............... | H01L 27/12 257/292 |
| 2011/0101433 A1 * | 5/2011 | Kim | ............... | H01L 27/0207 257/296 |
| 2011/0193150 A1 * | 8/2011 | Koo | ............... | H01L 27/0694 257/306 |

\* cited by examiner

SEMICONDUCTOR DEVICE AND SYSTEM INCLUDING THE SAME

CROSS-REFERENCE TO RELATED APPLICATION

The priority of Korean patent application No. 10-2015-0136447 filed on 25 Sep. 2015, the disclosure of which is hereby incorporated in its entirety by reference, is claimed.

BACKGROUND

1. Technical Field

Embodiments of the present disclosure relate to a semiconductor device and system including the same.

2. Related Art

Recently, with rapid development of semiconductor fabrication technologies, semiconductor integrated circuits (ICs) have become super-miniaturized and highly integrated. Additionally, operation speeds of semiconductor ICs is rapidly increasing. Therefore, noise (for example, parasitic capacitance, inductance, resistance, etc.) generated from the semiconductor circuit is increasing. Thus, a method for designing and arranging a circuit configured to stably provide a power-supply voltage to internal circuits of the semiconductor device is of importance.

Generally, a reservoir capacitor has been used to remove noise components (e.g., parasitic capacitance, inductance, resistance, etc.) as well as to stabilize the supply of a power-supply voltage.

The reservoir capacitor provides instantaneous current needed for high-speed operation of the semiconductor device, and prevents current from abruptly flowing from the external power source to internal circuits, such that the reservoir capacitor can prevent the occurrence of noise generated by a power line and can also prevent the occurrence of voltage drop.

Typically, the reservoir capacitor is disposed in a peripheral circuit region (also called a peripheral region). The peripheral region includes a plurality of peripheral circuits (for example, a sub word line driver, a sense amplifier, a power circuit, etc.) so as to control one or more cells as well as to provide the supply of a power voltage, etc.

Generally, an array-shaped region (such as X-Hole or Y-Dec) must guarantee an additional space in the remaining regions other than a basic cell frame region so as to form the reservoir capacitor. If the region of the reservoir capacitor is additionally provided in the remaining regions other than the cell frame region, the semiconductor chip may unavoidably increase in size.

BRIEF SUMMARY OF THE INVENTION

Various embodiments of the present disclosure are directed to providing a semiconductor device that substantially obviates one or more problems due to limitations and disadvantages of the related art.

The embodiments of the present disclosure relate to a semiconductor device in which a reservoir capacitor is disposed over a chip guard-ring, such that the semiconductor device can guarantee a space in which a reservoir capacitor can be formed without addition of a separate space.

In accordance with an aspect of the present disclosure, a semiconductor device includes: a first guard ring disposed in a first region; a second guard ring disposed in a second region; a first metal line and a second metal line respectively disposed over the first guard ring and the second guard ring, and respectively coupled to the first guard ring and the second guard ring; and a gate pattern coupled to the first metal line or the second metal line, wherein the first metal line and the second metal line are configured to respectively receive a first voltage and a second voltage, the second voltage having a different potential from the first voltage.

The first region is a PMOS region and the second region is an NMOS region, or the first region is the NMOS region and the second region is the PMOS region.

The gate pattern is formed at a layer above the first guard ring and the second guard ring, and is located at a layer below the first metal line and the second metal line.

If the gate pattern is coupled to the first metal line, a reservoir capacitor is formed between the gate pattern and the second metal line.

When the gate pattern is coupled to the first metal line, the gate pattern overlaps the first guard ring and semiconductor substrate, and the second metal line overlaps the gate pattern, and when the gate pattern is coupled to the second metal line, the gate pattern overlaps the second guard ring and semiconductor substrate, and the first metal line overlaps the gate pattern.

When the gate pattern is coupled to the first metal line, the gate pattern does not overlap the second guard ring, and when the gate pattern is coupled to the second metal line, the gate pattern does not overlap the first guard ring.

The gate pattern is arranged to partially overlap the first guard ring.

If the gate pattern is coupled to the second metal line, a reservoir capacitor is formed between the gate pattern and the first metal line. The gate pattern is arranged to partially overlap the second guard ring.

In accordance with another aspect of the present disclosure, a semiconductor device includes: a first guard ring formed to enclose a first region; a second guard ring formed to enclose a second region; a first metal line disposed over the first guard ring and configured to receive a first voltage; a second metal line disposed over the second guard ring and configured to receive a second voltage, the second voltage having a different potential from the first voltage; and a gate pattern located at a level disposed between the first and second metal lines and the first and second guard rings, one side of the gate pattern partially overlapped by the first metal line and the other side of the gate pattern partially overlapped by the second metal line, wherein, if one side of the gate pattern is electrically coupled to the first metal line and thus the gate pattern receives the first voltage, a reservoir capacitor is formed between the other side of the gate pattern and the second metal line.

The first region is a PMOS region and the second region is an NMOS region, or the first region is the NMOS region and the second region is the PMOS region.

The first guard ring and the second guard ring are partially separated from each other at a specific part at which the first region faces the second region.

A first transistor formed in the first region; and a second transistor formed in the second region.

Each of the first transistor and the second transistor includes: an active region; and a gate electrode formed to pass through the active region.

The first guard ring and the second guard ring are located at substantially the same level as the active region.

The first transistor and the second transistor are located at substantially the same level as the gate pattern.

Either the first guard ring or the second guard ring respectively include N-type impurity ions or P-type impurity ions, and the first guard ring includes different impurity ions than the second guard ring.

The first metal line and the second metal line are formed at substantially the same level.

Further comprising: a first contact formed to interconnect the first metal line and the first guard ring; and a second contact formed to interconnect the second metal line and the second guard ring.

The gate pattern is formed to partially overlap the first guard ring.

The gate pattern does not overlap the second guard ring.

Further comprising: a third metal line electrically coupled to the first metal line; and a fourth metal line coupled to the second metal line. The third metal line and the fourth metal line are located at substantially the same level.

It is to be understood that both the foregoing general description and the following detailed description are exemplary and explanatory and are intended to provide further explanation of the claims.

DESCRIPTION OF EMBODIMENTS

Reference will now be made in to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

In order to prevent current from abruptly flowing from an external power source to internal circuits of the semiconductor device during supply of instantaneous current needed for a high-speed operation of the semiconductor device, a reservoir capacitor may be formed such that not only noise generated by a power line but also a voltage drop can be prevented from occurring. In order to form the reservoir capacitor, there is needed a method for guaranteeing or providing the reservoir capacitor while simultaneously maintaining the size of a current region without guaranteeing or providing an additional region.

Figure 1:
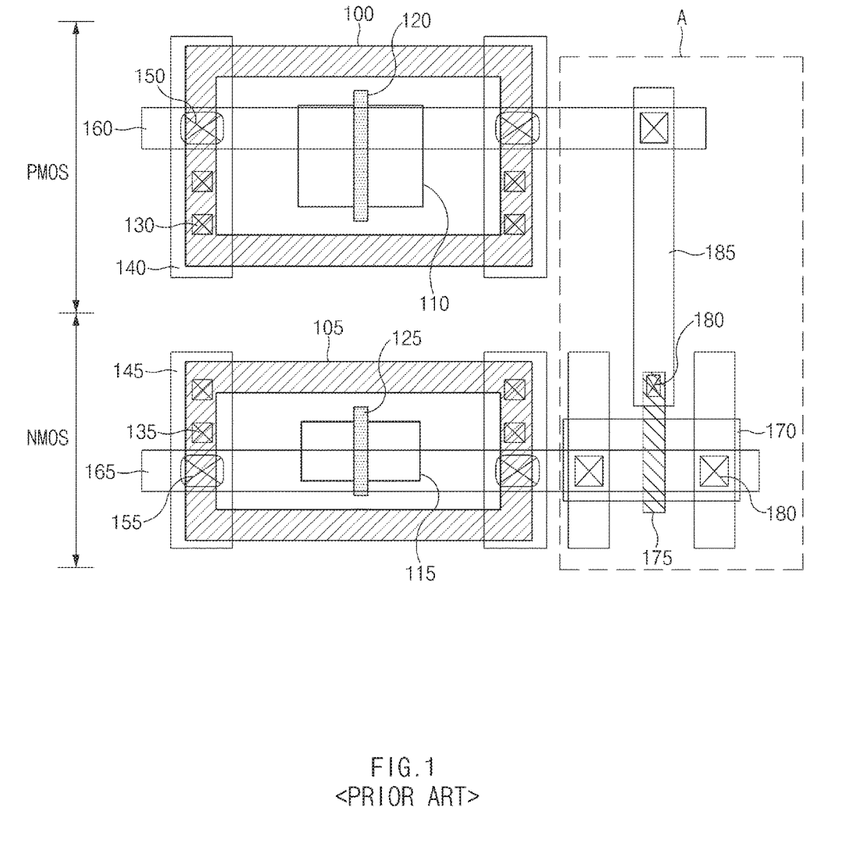
FIG. 1 is a layout diagram illustrating a semiconductor device including a reservoir capacitor for use in a general structure.

FIG. 1 is a layout diagram illustrating a semiconductor device including a reservoir capacitor for use in a general structure.

Referring to FIG. 1, the semiconductor device may include a PMOS region and an NMOS region. The semiconductor device may include a first guard ring 100 formed to enclose the PMOS region and a second guard ring 105 formed to enclose the NMOS region. In this case, the first guard ring 100 may be formed at the same level as in a first active region 110, and the second guard ring 105 may be formed at the same level as a second active region 115. The first guard ring 100 may include N-type impurity ions, and the second guard ring 105 may include P-type impurity ions.

The PMOS region may include a PMOS transistor comprised of a first active region 110 and a first gate electrode 120. The NMOS region may include an NMOS transistor comprised of a second active region 115 and a second gate electrode 125.

A first metal line 140 coupled to the first guard ring 100 through a first contact 130 may be disposed over the first guard ring 100 of the PMOS region, and a second metal line 145 coupled to the second guard ring 105 through a second contact 135 may be disposed over the second guard ring 105 of the NMOS region.

In addition, the PMOS region may include a third metal line 160 coupled to the first metal line 140 through a third contact 150 and disposed to cross the first metal line 140. In this case, the first metal line 140 and the third metal line 160 may receive a power-supply voltage (VDD).

The NMOS region may include a fourth metal line 165 coupled to the second metal line 145 through a fourth contact 155 and disposed to cross the second metal line 145. In this case, the second metal line 145 and the fourth metal line 165 may receive a ground voltage (Vss).

In order to form a reservoir capacitor in the layout structure of FIG. 1, the reservoir capacitor needs to be disposed in a separate region other than the cell frame region, as denoted by 'A' of FIG. 1.

As can be seen from reference symbol 'A' of FIG. 1, the reservoir capacitor may include a separate active region 170 located adjacent to an NMOS region, and a gate pattern 175 formed to cross the active region 170.

In addition, the reservoir capacitor may include a source/drain region formed at both sides of the active region 170, one or more contacts 180 formed at one side of the gate pattern 175, and a plurality of metal lines 185 respectively coupled to the contacts 180. Some metal lines 185 may receive a power-supply voltage (Vdd), and some other metal lines 185 may receive a ground voltage such that they can be used as a reservoir capacitor.

As described above, according to the conventional art, peripheral circuits have been disposed in a peripheral region (i.e., a peripheral circuit region), and a reservoir capacitor has been disposed in the remaining space.

However, in recent times, as the integration degree of semiconductor devices gradually increases, an arrangement space of the reservoir capacitor is also gradually increasing.

An object of the present disclosure may be to provide a structure for forming a reservoir capacitor without guaranteeing or providing an additional space.

Figure 2A:
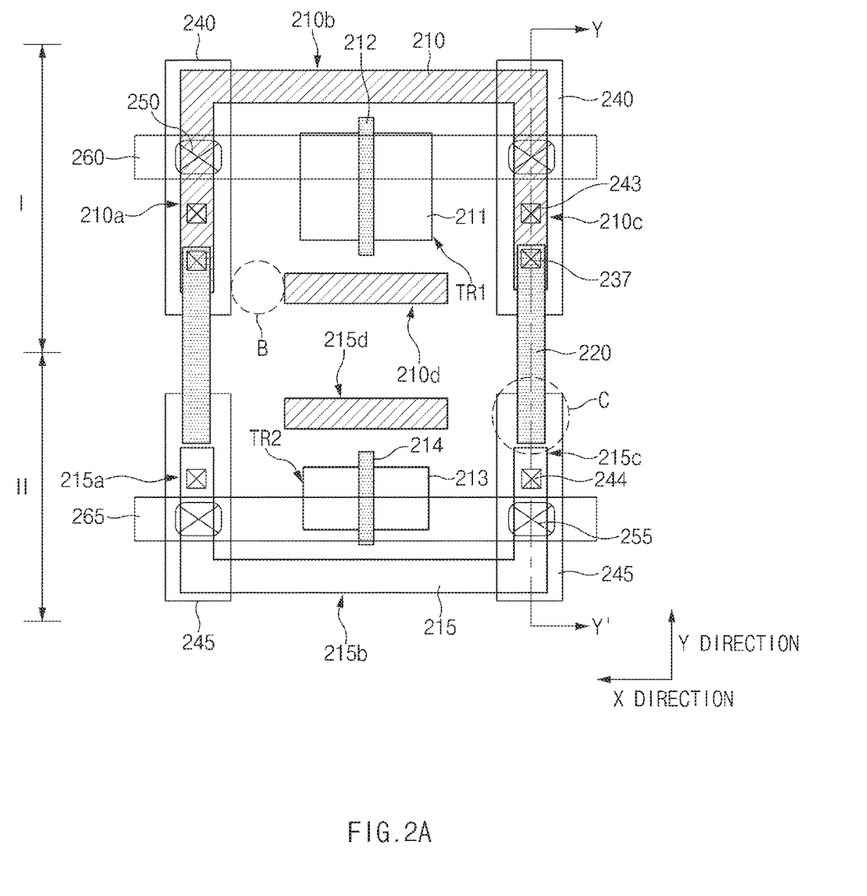
FIG. 2A is a layout diagram illustrating a representation of an example of a semiconductor device including a reservoir capacitor according to an embodiment.
Figure 2B:
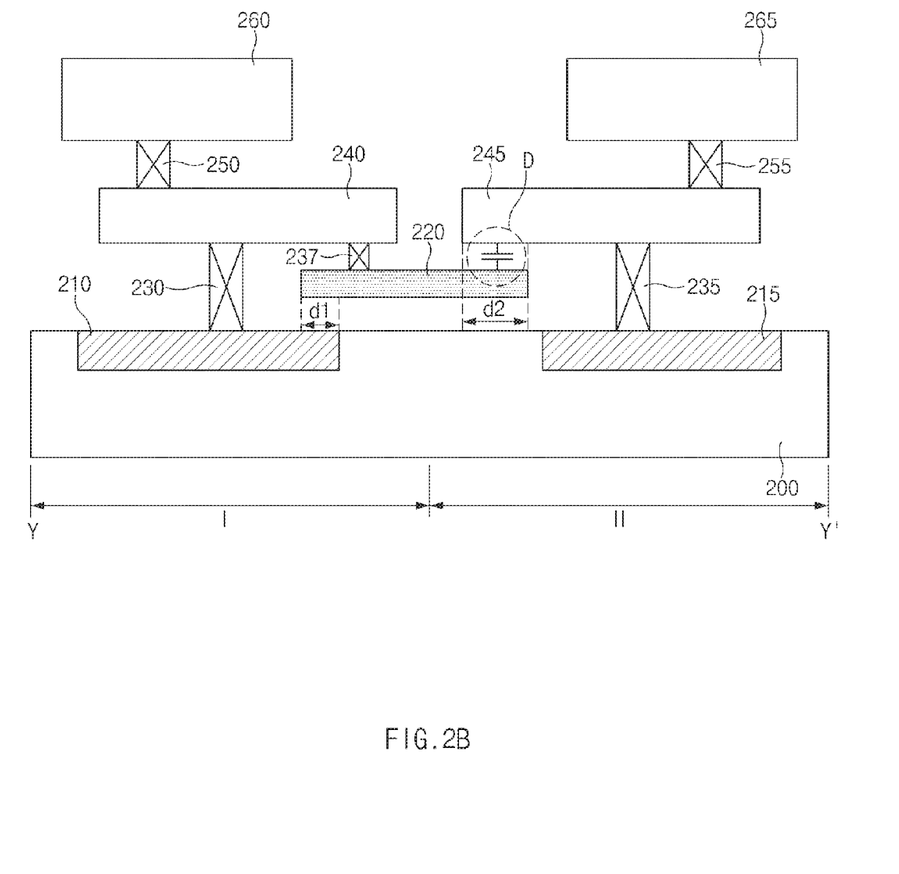
FIG. 2B is a cross-sectional view illustrating a representation of an example of a semiconductor device including a reservoir capacitor according to an embodiment.

FIGS. 2A and 2B illustrate representations of examples of a semiconductor device including a reservoir capacitor according to an embodiment.

FIG. 2A is a layout diagram illustrating a representation of an example of a semiconductor device including a reservoir capacitor according to an embodiment. FIG. 2B is a cross-sectional view illustrating a representation of an example of the semiconductor device taken along the line Y-Y' of FIG. 2A.

Referring to FIG. 2A, a first region (I) and a second region (II) may be contained in a cell frame. The first region (I) may be a PMOS region, and the second region (II) may be an NMOS region.

The first region (I) may include a first transistor TR1. The first transistor TR1 may include a first active region 211 and a first gate electrode 212 formed to pass through the first active region 211.

The semiconductor device illustrated in FIG. 2A may further include a first guard ring 210 formed to enclose the first region (I), and a second guard ring 215 formed to enclose the second region (II). Each guard ring may prevent external moisture or humidity from permeating into a semiconductor chip, and may also prevent other external elements from affecting other chips.

The first guard ring 210 and the second guard ring 215 may be formed to be short-circuited (as denoted by 'B') at a specific position at which the first region (I) faces the second region (II). For example, assuming that the first region (I) is comprised of four sides (210a, 210b, 210c, 210d), the first side 210a, the second side 210b, and the third side 210c may enclose the first transistor TR1. The first guard ring 210 of the fourth side 210d may be separated from the first guard ring 210 of each of the first side 210a and the third side 210c. In this case, although FIG. 2A illustrates that the fourth side 210d of the first guard ring 210 is separated from the first guard ring 210 of each of the first side 210a and the third side 210c for convenience of description and better understanding of the present disclosure, it should be noted that the present disclosure may further include another guard ring in which four sides are interconnected as necessary.

In this case, the first active region 211 and the first guard ring 210 may include the same type of impurity ions. For example, the first active region 211 and the first guard ring 210 may include N-type impurity ions.

The second region (II) may include a second transistor TR2. The second transistor TR2 may include a second active region 213 and a second gate electrode 214 formed to pass through the second active region 213.

A second guard ring 215 may be formed to enclose the second region (II). The second guard ring 215 may be partially short-circuited at a specific position at which the first region (I) faces the second region (II). For example, assuming that the second region (II) includes four sides (215a, 215b, 215c, 215d), the first side 215a, the second side 215b, and the third side 215c may be formed to enclose the second transistor TR2, and the second guard ring 215 of the fourth side 215d may be separated from the second guard ring 215 of each of the first side 215a and the third side 215c.

In this case, the second active region 213 and the second guard ring 215 may include the same type of impurity ions. For example, the second active region 213 and the second guard ring 215 may include P-type impurity ions.

A first metal line 240 electrically coupled to the first guard ring 210 may be disposed, and a second metal line 245 electrically coupled to the second guard ring 215 may be spaced apart from the first guard ring 210 by a predetermined distance. The first metal line 240 may be coupled to the first guard ring 210 through a first contact 243, and the second metal line 245 may be coupled to the second metal line 245 through a second contact 244.

The first metal line 240 and the second metal line 245 may be disposed over the same layer, and may be formed in a line shape extended in a direction (i.e., Y direction) parallel or substantially parallel to the first gate electrode 212 and the second gate electrode 214. In addition, the first metal line 240 and the second metal line 245 may overlap the first guard ring 210 and the second guard ring 215, respectively.

In this case, the first metal line 240 may receive a first voltage, and the second metal line 245 may receive a second voltage having a different potential from the first voltage. Here, the first voltage may be a relatively high voltage, and may be any one selected from among a power-supply voltage (Vdd), a high voltage (Vpp), a core voltage (Vcore), and a bit line precharge voltage (Vblp). In addition, the second voltage may be a relatively low voltage, and may be a ground voltage (Vss) or a back-bias voltage (Vbb). Preferably, the first voltage may be a power-supply voltage (Vdd), and the second voltage may be a ground voltage (Vss).

A gate pattern 220 may be additionally disposed between the first region (I) and the second region (II). The gate pattern 220 may be disposed between the first side 210a of the first guard ring 210 and the first side 215a of the second guard ring 215, and may be formed in a line shape extended in a direction (i.e., Y direction) parallel to or substantially parallel to the first gate electrode 212 and the second gate electrode 214. In addition, the gate pattern 220 may partially overlap the first guard ring 210, and may not overlap the second guard ring 215 as necessary.

The gate pattern 220 may be disposed over the same layer as the first gate electrode 212 and the second gate electrode 214. One side of the gate pattern 220 may be coupled to the first metal line 240 through a third contact 237, and may partially overlap the first guard ring 210 of a lower layer. Since the gate pattern 220 is coupled to the first metal line 240, the gate pattern 220 may also receive the first voltage.

As a result, a reservoir capacitor may be formed between the gate pattern 220 receiving the first voltage and the second metal line 245 receiving the second voltage because there is a difference in potential between the first voltage and the second voltage (See 'C' of FIG. 2A). In this case, capacitance per chip may be established in different ways according to categories of the first voltage and the second voltage.

For example, assuming that the first voltage is based on a power-supply voltage (Vdd) and the second voltage is based on a ground voltage (Vss), capacitance per chip may be established in the range of 1 nF~100 nF. In the case of using the Vpp- or Vbb-based voltage, capacitance per chip may be established in the range of 1 nF~100 nF. In addition, assuming that the first voltage is based on a core voltage (Vcore) and the second voltage is based on a ground voltage (Vss), capacitance per chip may be established in the range of 1 nF~50 nF. In the case of using the Vblp- and Vss-based voltage, capacitance per chip may be established in the range of 0.1 nF~30 nF. In the case of using the Vcp- and Vss-based voltage, capacitance per chip may be established in the range of 0.1 nF~30 nF.

The first region (I) may include a third metal line 260, and the second region (II) may include a fourth metal line 265.

The third metal line 260 may be coupled to the first metal line 240 through a fourth contact 250, and may be formed in a line shape extended in a direction (i.e., X direction) perpendicular to or substantially perpendicular to the first metal line 240. Since the third metal line 260 is electrically coupled to the first metal line 240, the same voltage as the first voltage applied to the first metal line may be applied to the third metal line 260.

The fourth metal line 265 may be coupled to the second metal line 245 through a fifth contact 255. The fourth metal line 265 may be formed in a line shape extended in a direction (i.e., X direction) perpendicular to or substantially perpendicular to the second metal line 245. Since the fourth metal line 265 is electrically coupled to the second metal line 245, the same voltage as the second voltage applied to the second metal line 245 may be applied to the fourth metal line 265.

FIG. 2B is a cross-sectional view illustrating a representation of an example of the semiconductor device taken along the line Y-Y' of FIG. 2A. The semiconductor device including a reservoir capacitor according to an embodiment will hereinafter be described with reference to FIG. 2B.

Referring to FIG. 2B, a first region (I) of a semiconductor substrate 200 may include a first guard ring 210, and a second region (II) of the semiconductor substrate 200 may include a second guard ring 215. The first guard ring 210 and the second guard ring 215 may be formed by implanting impurity ions into the semiconductor substrate 200.

The first guard ring 210 may be formed by implantation of N-type impurity ions, and the second guard ring 215 may be formed by implantation of P-type impurity ions.

A gate pattern 220 may be disposed over the first guard ring 210 and the second guard ring 215. Although an insulation film may be interposed between respective lines, a detailed description of the insulation film interposed between the respective lines will herein be omitted for convenience of description.

The gate pattern 220 interposed between the first region (I) and the second region (II) may be formed to be extended to the first region (I) and the second region (II). The gate pattern 220 illustrated in FIG. 2B may extend farther into the first region (I) than the second region (II), such that the gate pattern 220 may partially overlap the first guard ring 210 by a predetermined distance (d1) of FIG. 2B. However, the predetermined distance (d1) may not be especially limited, and may be adjusted in the overlap range between the gate pattern 220 and the first guard ring 210.

The first metal line 240 and the second metal line 245 may be formed over the first guard ring 210, the second guard ring 215, and the gate pattern 220. The first metal line 240 and the second metal line 245 may be spaced apart from each other by a predetermined distance, and each of the first and second metal lines (240, 245) may partially overlap both sides of the gate pattern 220.

One side of the gate pattern 220 may be electrically coupled to the first metal line 240 through a third contact 237, and the other side of the gate pattern 220 adjacent to the second metal line 245 may not be coupled to the second metal line 245. In this case, the reservoir capacitor may be formed only when the second metal line 245 and the gate pattern 220 not coupled to each other partially overlap each other, such that the second metal line 245 and the gate pattern 220 must overlap each other (See 'd2' of FIG. 2B). Capacitance of each capacitor increases in proportion to the increasing critical dimension (CD) of the gate pattern 220, such that the gate pattern 220 may be maximized in length within the range within which the gate pattern 220 does not overlap the second guard ring 215.

The first metal line 240 may receive a first voltage, and the gate pattern 220 coupled to the first metal line 240 may also receive the first voltage. The second metal line 245 may receive a second voltage, and the second metal line 245 may receive a second voltage having a different potential from the first voltage.

Here, since there is a difference in potential between the first voltage applied to the gate pattern 220 and the second voltage applied to the second metal line 245, the reservoir capacitor may be formed as denoted by 'D' of FIG. 2B.

The third metal line 260 may be formed over the first metal line 240, and the first metal line 240 and the third metal line 260 may be interconnected through a fourth contact 250. In addition, the fourth metal line 265 may be formed over the second metal line 245, and the second metal line 245 and the fourth metal line 265 may be interconnected through a fifth contact 255.

As described above, since the gate pattern coupled to the guard ring is added to the semiconductor device of an embodiment, an additional reservoir capacitor may be easily formed without difficulty in fabrication.

In addition, since the reservoir capacitor can be added without increasing the size of a basic cell frame, many more reservoir capacitors can be formed without formation of an additional space, and it may be possible to address an unexpected problem in which an insufficient number of reservoir capacitors occur due to reduction of a chip size.

Figure 3A:
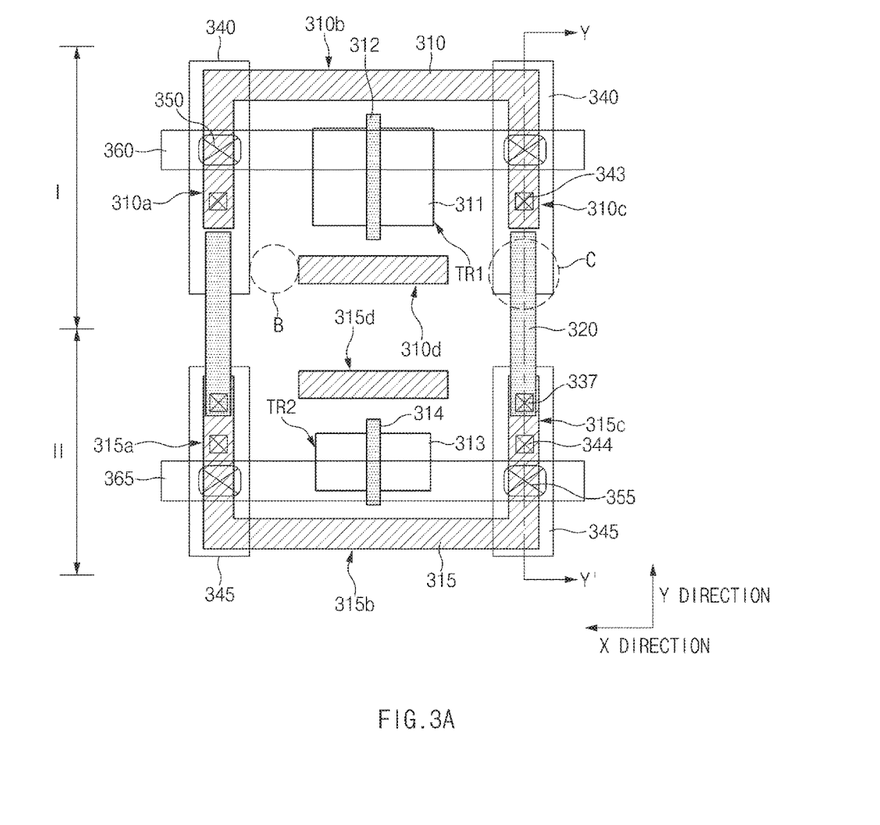
FIG. 3A is a layout diagram illustrating a semiconductor device including a representation of an example of a reservoir capacitor according to an embodiment.
Figure 3B:
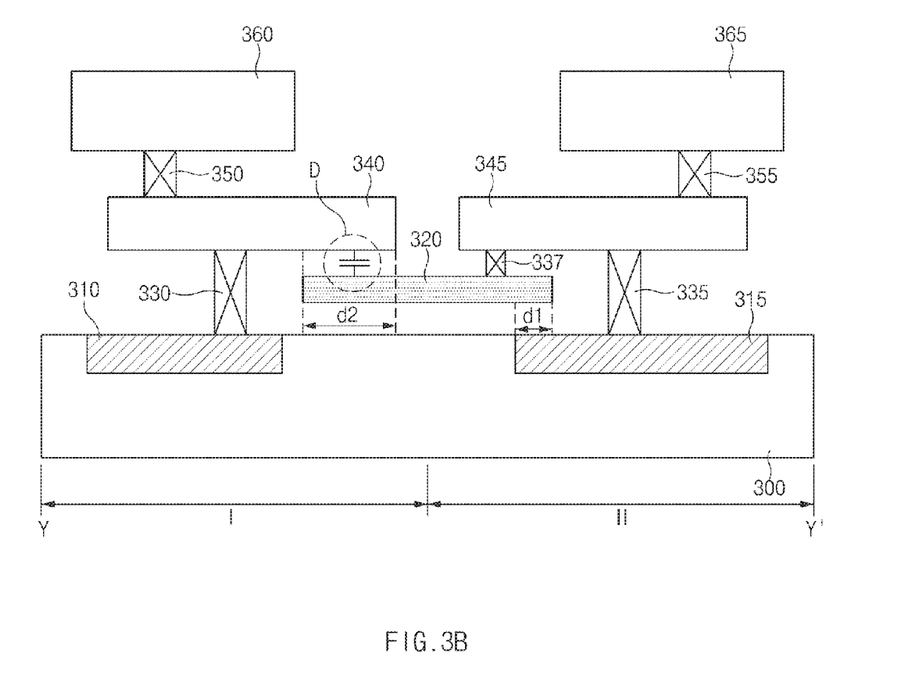
FIG. 3B is a cross-sectional view illustrating a representation of an example of a semiconductor device including a reservoir capacitor according to an embodiment.

FIGS. 3A and 3B illustrate representations of examples of a semiconductor device including a reservoir capacitor according to an embodiment.

FIG. 3A is a layout diagram illustrating a representation of an example of a semiconductor device including a reservoir capacitor according to an embodiment. FIG. 3B is a cross-sectional view illustrating a representation of an example of a semiconductor device including a reservoir capacitor according to an embodiment.

Referring to FIG. 3A, a first region (I) and a second region (II) may be contained in a cell frame. The first region (I) may be a PMOS region, and the second region (II) may be an NMOS region.

The first region (I) may include a first transistor TR1. The first transistor TR1 may include a first active region 311 and a first gate electrode 312 formed to pass through the first active region 311.

The semiconductor device illustrated in FIG. 3A may further include a first guard ring 310 formed to enclose the first region (I), and a second guard ring 315 formed to enclose the second region (II). Guard ring 315 may prevent external moisture or humidity from permeating into a semiconductor chip, and may also prevent other external elements from affecting other chips. Guard ring 310 may prevent external moisture or humidity from permeating into a semiconductor chip, and may also prevent other external elements from affecting other chips.

Although a general guard ring is formed to enclose the entire cell region, the first guard ring 310 and the second guard ring 315 illustrated in FIG. 3A may be formed to be short-circuited (as denoted by 'B') at a specific position at which the first region (I) faces the second region (II).

For example, assuming that the first guard ring 310 enclosing the first region (I) is comprised of four sides (310a, 310b, 310c, 310d), the first side 310a, the second side 310b, and the third side 310c may enclose the first transistor TR1. The first guard ring 310 of the fourth side 310d may be separated from the first guard ring 310 of each of the first side 310a and the third side 310c.

In this case, the first active region 311 and the first guard ring 310 may include N-type impurity ions.

In the same manner as in the first region (I), the second region (II) adjacent to the first region (I) may include a second transistor TR2. The second transistor TR2 may include a second active region 313 and a second gate electrode 314 formed to pass through the second active region 313.

In addition, a second guard ring 315 may be formed to enclose the second region (II). The second guard ring 315 may be partially short-circuited at a specific position at which the first region (I) faces the second region (II).

For example, assuming that the second guard ring 315 enclosing the second region (II) includes four sides (315a, 315b, 315c, 315d), the first side 315a, the second side 315b, and the third side 315c may be formed to enclose the second transistor TR2, and the second guard ring 315 of the fourth side 315d may be partially short-circuited with the second guard ring 315 of the first side 315a and the third side 315c. In this case, although FIG. 3A illustrates that the fourth side 310d of the first guard ring 310 is separated from the first guard ring 310 of each of the first side 310a and the third side 310c for convenience of description and better understanding of the present disclosure, it should be noted that the present disclosure may further include another guard ring in which four sides are interconnected as necessary.

In this case, the second active region 313 and the second guard ring 315 may include different types of impurity ions. For example, the second active region 313 and the second guard ring 315 may include P-type impurity ions.

A first metal line 340 overlapping with the first side 310a and the third side 310c of the first guard ring 310 may be disposed over the first guard ring 310, and a second metal line 345 overlapping with the first side 315a and the third side 315c of the second guard ring 315 may be disposed over the second guard ring 315.

The first metal line 340 may be electrically coupled to the first guard ring 310 through a first contact 343, and the second metal line 345 may be electrically coupled to the second guard ring 315 through a second contact 344.

The first metal line 340 and the second metal line 345 may be located at the same level, and may be formed in a line pattern extended in the Y direction parallel to or substantially parallel to the first gate electrode 312 and the second gate electrode 314. The first metal line 340 and the second metal line 345 may be spaced apart from each other by a predetermined distance at a specific position between the first region (I) and the second region (II).

The first metal line 340 may receive a first voltage, and the second metal line 345 may receive a second voltage having a different potential from the first voltage. Here, the first voltage corresponding to a relatively high voltage may be any one selected from among a power-supply voltage (Vdd), a high voltage (Vpp), a core voltage (Vcore), and a bit line precharge voltage (Vblp). In addition, the second voltage corresponding to a relatively low voltage may be a ground voltage (Vss) or a back-bias voltage (Vbb). Preferably, the first voltage may be a power-supply voltage (Vdd), and the second voltage may be a ground voltage (Vss).

In addition, a gate pattern 320 may be additionally disposed between the first region (I) and the second region (II). The gate pattern 320 may be disposed between the first side 310a of the first guard ring 310 and the first side 315a of the second guard ring 315, and may be disposed between the third side 310c of the first guard ring 310 and the third side 315c of the second guard ring 315.

The gate pattern 320 may be formed at the same level as the gate electrode formed in the cell region, and may be formed of the same material as the gate electrode formed in the cell region. For example, the gate pattern 320 may include any one of a W-based (tungsten-based) material, a WSi-based (tungsten silicon-based) material, a WN-based (tungsten nitride-based) material, a TiSi-based (titanium silicon-based) material, and a CoSi-based (Cobalt silicon-based) material.

The gate pattern 320 may be formed in a line pattern extended in the direction (i.e., Y direction) parallel to or substantially parallel to the first gate electrode 312 and the second gate electrode 314. In addition, the gate pattern 320 may not overlap the first guard ring 310, and may partially overlap the second guard ring 315.

The gate pattern 320 may be formed at the same level as the first gate electrode 312 and the second gate electrode 314. One side of the gate pattern 320 may be coupled to the second metal line 345 through a third contact 337. Since the gate pattern 320 is coupled to the second metal line 345, the gate pattern 320 may also receive the second voltage in the same manner as the second metal line 345.

Here, since there is a difference in potential between the gate pattern 320 receiving the second voltage and the first metal line 340 receiving the first voltage, the reservoir capacitor may be formed as denoted by 'C' of FIG. 3A. In this case, capacitance per chip may be established in different ways according to categories of the first voltage and the second voltage.

For example, assuming that the first voltage is based on a power-supply voltage (Vdd) and the second voltage is based on a ground voltage (Vss), capacitance per chip may be established in the range of 1 nF~100 nF. In the case of using the Vpp- or Vbb-based voltage, capacitance per chip may be established in the range of 1 nF~100 nF. In addition, assuming that the first voltage is based on a core voltage (Vcore) and the second voltage is based on a ground voltage (Vss), capacitance per chip may be established in the range of 1 nF~50 nF. In the case of using the Vblp- and Vss-based voltage, capacitance per chip may be established in the range of 0.1 nF~30 nF. In the case of using the Vcp- and Vss-based voltage, capacitance per chip may be established in the range of 0.1 nF~30 nF.

In addition, the first region (I) may include a third metal line 360, and the second region (II) may include a fourth metal line 365.

The third metal line 360 may be coupled to the first metal line 340 through a fourth contact 350, and may be formed in a line shape extended in the X direction perpendicular to or substantially perpendicular to the first metal line 340. Since the third metal line 360 is electrically coupled to the first metal line 340, the first voltage identical to the voltage applied to the first metal line 340 may be applied to the third metal line 360.

The fourth metal line 365 may be coupled to the second metal line 345 through a fifth contact 355. The fourth metal line 365 may be formed in a line shape extended in the X direction perpendicular to or substantially perpendicular to the second metal line 345. Since the fourth metal line 365 is electrically coupled to the second metal line 345, a second voltage identical to the voltage applied to the second metal line 345 may be applied to the fourth metal line 365.

FIG. 3B is a layout diagram illustrating a representation of an example of a semiconductor device including a reservoir capacitor according to an embodiment.

FIG. 3B is a cross-sectional view illustrating a representation of an example of the semiconductor device taken along the line Y-Y' of FIG. 3A. The semiconductor device including the reservoir capacitor according to an embodiment will hereinafter be described with reference to FIG. 3B.

Referring to FIG. 3B, the first region (I) of a semiconductor substrate 300 may include a first guard ring 310, and the second region (II) may include a second guard ring 315. In this case, the first region (I) may be a PMOS region, and the second region (II) may be an NMOS region.

The first guard ring 310 and the second guard ring 315 may be formed at the same level as the active region of the semiconductor substrate 300, and may be formed by implanting impurity ions into the semiconductor substrate 300. For example, the first guard ring 310 located in the first region (I) may be formed by implantation of N-type impurity ions, and the second guard ring 315 located in the second region (II) may be formed by implantation of P-type impurity ions.

A gate pattern 320 may be formed over the first guard ring 310 and the second guard ring 315. Although an insulation film may be interposed between respective lines, a detailed description of the insulation film interposed between the respective lines will herein be omitted for convenience of description.

The gate pattern 320 interposed between the first region (I) and the second region (II) may be formed to be extended to the first region (I) and the second region (II). The gate pattern 320 illustrated in FIG. 3B may extend farther into the second region (II) than the first region (I), such that the gate pattern 320 may partially overlap the second guard ring 315 by a predetermined distance (d1) of FIG. 3B. However, the predetermined distance (d1) may not be especially limited, and may be adjusted in the overlap range between the gate pattern 320 and the second guard ring 315.

The first metal line 340 and the second metal line 345 may be formed over the first guard ring 310, the second guard ring 315, and the gate pattern 320.

The first metal line 340 may be electrically coupled to the first guard ring 310 through a first contact 330, and the second metal line 345 may be electrically coupled to the second guard ring 315 through a second contact 335.

The first metal line 340 and the second metal line 345 may be formed at the same level, and may be spaced apart from each other by a predetermined distance, and each of the first and second metal lines (340, 345) may partially overlap both sides of the gate pattern 320.

The first metal line 340 and the second metal line 345 may be formed to overlap both sides of the gate pattern 320.

One side of the gate pattern 320 may be electrically coupled to the second metal line 345 through a third contact 337, and the other side of the gate pattern 320 adjacent to the first metal line 340 may not be coupled to the first metal line 340. In this case, the reservoir capacitor may be formed only when the first metal line 340 and the gate pattern 320 not coupled to each other partially overlap each other, such that the first metal line 340 and the gate pattern 320 must overlap each other (See 'd2' of FIG. 3B). Capacitance of each capacitor increases in proportion to the increasing critical dimension (CD) of the gate pattern 320, such that the gate pattern 320 may be maximized in length within the range within which the gate pattern 320 does not overlap the second guard ring 315.

The first metal line 340 formed over the gate pattern 320 may receive a first voltage. The second metal line 345 coupled to the gate pattern 320 may receive a second voltage having a different potential from the first voltage.

In this case, the first voltage may be any one selected from among a power-supply voltage (Vdd), a high voltage (Vpp), a core voltage (Vcore), and a bit line precharge voltage (Vblp). In addition, the second voltage may be a ground voltage (Vss) or a back-bias voltage (Vbb). Preferably, the first voltage may be a power-supply voltage (Vdd), and the second voltage may be a ground voltage (Vss).

In this case, the reservoir capacitor may be formed at the portion 'D' of FIG. 3B. The reservoir capacitor may be formed by a difference in potential between the second voltage applied to the gate pattern 320 and the first voltage applied to the first metal line 340. In the reservoir capacitor, the gate pattern 320 may be used as a lower electrode, the first metal line 340 may be used as an upper electrode, and an insulation film (not illustrated) interposed between the gate pattern 320 and the first metal line 340 may be used as a dielectric film.

The third metal line 360 may be formed over the first metal line 340, and the first metal line 340 and the third metal line 360 may be electrically interconnected through a fourth contact 350.

In addition, the fourth metal line 365 may be formed over the second metal line 345, and the second metal line 345 and the fourth metal line 365 may be electrically interconnected through a fifth contact 355.

As described above, the gate pattern coupled to the guard ring is added such that an additional reservoir capacitor can be easily formed without difficulty in fabrication.

In addition, the reservoir capacitor can be added without increasing the size of a basic cell frame, and many more reservoir capacitors can be formed without formation of an additional space, such that the embodiments of the present disclosure can address an unexpected problem in which an insufficient number of reservoir capacitors occur due to reduction of a chip size.

As is apparent from the above description, the embodiments of the present disclosure may have the following effects caused by addition of a gate pattern coupled to a guard ring.

First, the gate pattern coupled to the guard ring is easily formed without difficulty in fabrication, such that an additional reservoir capacitor can be formed without increasing fabrication difficulty.

Second, the reservoir capacitor can be formed using the guard ring, such that the reservoir capacitor can be added without increasing the size of a basic cell frame.

Third, since many more reservoir capacitors can be formed without formation of an additional space, it may be possible to address an unexpected problem in which an insufficient number of reservoir capacitors occur due to reduction in chip size.

The semiconductor device discussed above (see FIGS. 2A-3B) are particular useful in the design of memory devices, processors, and computer systems. For example, referring to FIG. 4, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 4:
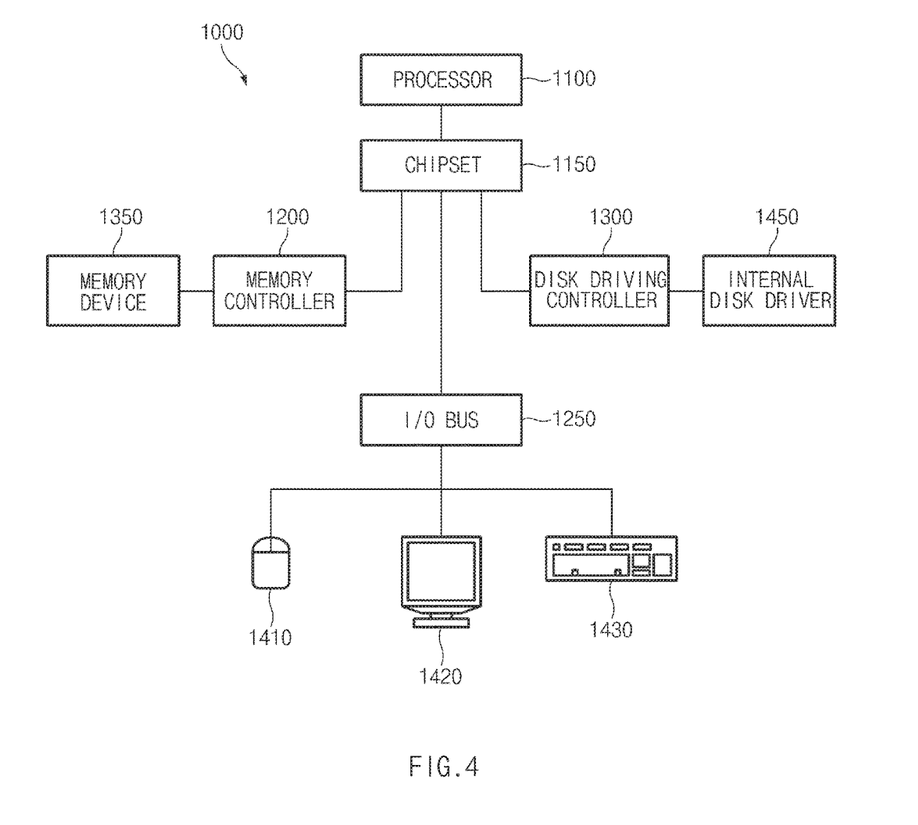
FIG. 4 illustrates a block diagram of an example of a representation of a system employing a semiconductor device including a reservoir capacitor in accordance with the various embodiments discussed above with relation to FIGS. 2A-3B.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 2A-3B. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 2A-3B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor device including a reservoir capacitor as discussed above with relation to FIGS. 2A-3B. In alternate embodiments, such as, for example but not limited to, cellular phones or digital cameras, the components may differ from the embodiments illustrated in FIG. 4.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The embodiments are not limited by the type of deposition, etching polishing, and patterning steps described herein. Nor are embodiments limited to any specific type of semiconductor devices. For example, embodiments may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first guard ring disposed in a first region;
   a second guard ring disposed in a second region;
   a first metal line and a second metal line respectively disposed over the first guard ring and the second guard ring, and respectively electrically coupled to the first guard ring and the second guard ring; and
   a gate pattern electrically coupled to the first metal line or the second metal line, wherein the first metal line and the second metal line are configured to respectively receive a first voltage and a second voltage, the second voltage having a different potential from the first voltage,
   wherein the first guard ring, the first metal line and the gate pattern are vertically overlapped, and
   wherein the first region is a PMOS region and the second region is an NMOS region, or the first region is the NMOS region and the second region is the PMOS region.

2. The semiconductor device according to claim 1, wherein the gate pattern is formed at a layer above the first guard ring and the second guard ring, and is located at a layer below the first metal line and the second metal line.

3. The semiconductor device according to claim 1, wherein the gate pattern is coupled to the first metal line and vertically overlapped with the second metal line to form a reservoir capacitor between the gate pattern and the second metal line.

4. The semiconductor device according to claim 1, wherein
   the gate pattern is coupled to the second metal line to form a reservoir capacitor between the gate pattern and the first metal line.

5. The semiconductor device according to claim 4, wherein the gate pattern is arranged to partially overlap the second guard ring.

6. A semiconductor device comprising:
   a first guard ring disposed in a first region;
   a second guard ring disposed in a second region;
   a first metal line disposed over the first guard ring and configured to receive a first voltage;
   a second metal line disposed over the second guard ring and configured to receive a second voltage, the second voltage having a different potential from the first voltage; and
   a gate pattern located at a level disposed between the first and second metal lines and the first and second guard rings, one side of the gate pattern partially and vertically overlapped by the first metal line and the first guard ring, and the other side of the gate pattern partially and vertically overlapped by the second metal line,
   wherein the gate pattern is electrically coupled to the first metal line or the second metal line, and
   wherein the first region is a PMOS region and the second region is an NMOS region, or the first region is the NMOS region and the second region is the PMOS region.

7. The semiconductor device according to claim 6, wherein the first guard ring and the second guard ring are partially separated at a specific part at which the first region faces the second region.

8. The semiconductor device according to claim 6, further comprising:
   a first transistor formed in the first region; and
   a second transistor formed in the second region.

9. The semiconductor device according to claim 8, wherein each of the first transistor and the second transistor includes:
   an active region; and
   a gate electrode formed to pass through the active region.

10. The semiconductor device according to claim 9, wherein the first guard ring and the second guard ring are located at substantially the same level as the active region.

11. The semiconductor device according to claim 9, wherein the first transistor and the second transistor are located at substantially the same level as the gate pattern.

12. The semiconductor device according to claim 6, wherein either the first guard ring or the second guard ring respectively include N-type impurity ions or P-type impurity ions, and the first guard ring includes different impurity ions than the second guard ring.

13. The semiconductor device according to claim 6, wherein the first metal line and the second metal line are formed at substantially the same level.

14. The semiconductor device according to claim 6, further comprising:
   a first contact formed to interconnect the first metal line and the first guard ring; and
   a second contact formed to interconnect the second metal line and the second guard ring.

15. The semiconductor device according to claim 6, wherein the gate pattern is formed to partially overlap the first guard ring or the second guard ring.

16. The semiconductor device according to claim 6, further comprising:
   a third metal line electrically coupled to the first metal line; and
   a fourth metal line coupled to the second metal line.

17. The semiconductor device according to claim 6, wherein the third metal line and the fourth metal line are located at substantially the same level.

* * * * *